US010120004B1

(12) United States Patent
Tsai et al.

(10) Patent No.: US 10,120,004 B1
(45) Date of Patent: Nov. 6, 2018

(54) POWER CONSUMPTION ANALYZING SERVER AND POWER CONSUMPTION ANALYZING METHOD THEREOF

(71) Applicant: Institute For Information Industry, Taipei (TW)

(72) Inventors: Chia-Wei Tsai, Keelung (TW); Yung-Chieh Hung, Taipei (TW); Kuei-Chun Chiang, Taipei (TW)

(73) Assignee: Institute For Information Industry, Taipei (TW)

( * ) Notice: Subject to any disclaimer, the term of this patent is extended or adjusted under 35 U.S.C. 154(b) by 0 days.

(21) Appl. No.: 15/814,714

(22) Filed: Nov. 16, 2017

(30) Foreign Application Priority Data

Oct. 20, 2017 (TW) .............................. 106136185 A (51) Int. Cl.
*G01R 21/133* (2006.01)
*G06Q 10/04* (2012.01)
*H02J 3/14* (2006.01)
*G06F 15/00* (2006.01)
*H05B 37/02* (2006.01)
*G05D 9/00* (2006.01)

(52) U.S. Cl.
CPC ......... *G01R 21/1333* (2013.01); *G06F 15/00* (2013.01); *G06Q 10/04* (2013.01); *H02J 3/14* (2013.01); *G05B 2219/2642* (2013.01); *G05D 9/00* (2013.01); *H05B 37/029* (2013.01)

(58) Field of Classification Search
CPC .......... G06F 15/00; G05D 9/00; G06Q 10/04; H02J 3/14
See application file for complete search history.

(56) References Cited

U.S. PATENT DOCUMENTS

| 8,335,649 B1 * | 12/2012 | Hoff | G01W 1/12 |
| | | | 702/3 |
| 8,412,491 B2 * | 4/2013 | Souilmi | G01D 4/004 |
| | | | 700/291 |
| 8,682,585 B1 * | 3/2014 | Hoff | H02S 50/10 |
| | | | 702/3 |
| 9,880,230 B1 * | 1/2018 | Hoff | G01W 1/12 |
| 2013/0073060 A1 * | 3/2013 | Dawley | H02J 13/001 |
| | | | 700/20 |

(Continued)

*Primary Examiner* — Douglas W Owens
*Assistant Examiner* — Syed M Kaiser
(74) *Attorney, Agent, or Firm* — Skaar Ulbrich Macari, P.A.

(57) ABSTRACT

A power consumption analyzing server and a power consumption analyzing method thereof are provided. According to the user data, the power consumption analyzing server clusters users into a plurality of groups. For each group, the power consumption analyzing server generates M+1 number of encoded outputs by inputting total power consumption time sequence data corresponding to a reference user in the group into an autoencoder. For each group, the power consumption analyzing server receives an actual appliance measurement data from an energy management system apparatus of the reference user, and labels M number of encoded outputs of the M+1 number of encoded outputs to map them to M categories of appliances. Finally, for each group, the power consumption analyzing server establishes a non-intrusive load monitoring system model of the group.

20 Claims, 6 Drawing Sheets

(56) References Cited

U.S. PATENT DOCUMENTS

2014/0336960 A1* 11/2014 Haghighat-Kashani ...................... G06Q 10/04 702/60
2016/0349407 A1* 12/2016 Hoff ........................ G06Q 10/04
2017/0075778 A1* 3/2017 Heliker ............... G06F 11/0751

* cited by examiner

POWER CONSUMPTION ANALYZING SERVER AND POWER CONSUMPTION ANALYZING METHOD THEREOF

PRIORITY

This application claims priority to Taiwan Patent Application No. 106136185 filed on Oct. 20, 2017, which is hereby incorporated by reference in its entirety.

FIELD

The present invention relates to a power consumption analyzing server and a power consumption analyzing method thereof. More particularly, the power consumption analyzing server of the present invention executes a power consumption analyzing method to establish a non-intrusive load monitoring system (NILM) model according to a plurality of user data.

BACKGROUND

With the rapid development of data analysis science, the technology of data analysis has become mature gradually. Therefore, various kinds of data are collected and analyzed to provide relevant reference information for various uses. In recent years, the construction of smart electricity meters has become the mainstream, and the smart electricity meters can report total power consumption of users via networks. Therefore, a problem being considered in the art is how to analyze the power consumption of user appliances to identify a use status of the user appliances in a certain period of time based on the total power consumption of the user, and establish a power consumption analyzing model for the user to further provide diversified applications according to the data being collected, e.g., provide a suggestion for the power consumption habit and behavior of the user according to the power consumption analyzing model.

Conventional user appliance power consumption analyzing technology collects total power consumption data (e.g., total power) of a user to further estimate the power consumption of main appliances through a non-intrusive electricity load monitoring technology. However, in order to obtain accurate power consumption feature values of the appliances, the conventional non-intrusive electricity load monitoring technology needs to obtain the total power consumption data of the user at a high sampling frequency (which is generally greater than 1 Hz), and then manual intervention is required to perform analysis and judgment to distinguish and label the power consumption feature values of various appliances from the total power consumption data of the user to generate labeled data. Therefore, the cost of establishing the power consumption analyzing model is very high, especially in the case where most of smart electricity meters are not capable of obtaining the total power consumption data of the user at a high sampling frequency.

Moreover, different users may be under different environments, so service providers may need to re-obtain the total power consumption data of the users to establish different power consumption analyzing models to overcome the environmental factors in order to ensure that the power consumption analyzing model can suit each of the users. Otherwise, the problem of overfitting is very likely to occur (i.e., excessive parameters are used when establishing the power consumption analyzing model) by applying the same power consumption analyzing model to users under different environments. Therefore, the cost of establishing the power consumption analyzing models will be further increased remarkably by establishing a power consumption analyzing model for each of the users in order to provide reliable power consumption analyzing service for the users.

Accordingly, an urgent need exists in the art to provide a power consumption analyzing mechanism, which can label the power consumption feature values of various appliances from the total power consumption data of the user without the need of obtaining the total power consumption data of the user at a high sampling rate and without the need of manual intervention for analyzing the total power consumption data of the user, thereby reducing the cost of establishing the power consumption analyzing model.

SUMMARY

An objective of certain embodiments includes providing a power consumption analyzing mechanism to establish a power consumption analyzing model for users. The power consumption analyzing mechanism establishes the power consumption analyzing model for a group of users by the following operations of: clustering the users into a plurality of groups, generating a plurality of encoded outputs by inputting a power consumption datum of a reference user among the users corresponding to each of the groups into an autoencoder, and meanwhile labeling the encoded outputs according to the actual appliance measurement datum from an energy management system apparatus of the reference user so as to map the encoded outputs to multiple categories of appliances. In this way, as compared to the prior art, the power consumption analyzing mechanism of the present invention can obtain the total power consumption data of the user by measuring at a low sampling rate (e.g., one sample per minute), and generate labeled data without manual intervention so as to establish a dedicated power consumption analyzing model for each group of users. Moreover, the power consumption analyzing mechanism of the present invention can further adjust the power consumption analyzing model based on the actual appliance measurement datum of the energy management system apparatus of the user, thereby improving the tolerance to various environments.

The disclosure includes a power consumption analyzing server, which comprises a network interface, a storage and a processor electrically connected to the network interface and the storage. The storage is configured to store a user database that records a user datum of each of a plurality of users. The processor is configured to execute the following steps of: (a) clustering the users into a plurality of groups according to the user data; (b) for each of the groups, generating M+1 encoded outputs by inputting a total power consumption time sequence datum of a reference user corresponding to the group among the user data into an autoencoder, where M is a positive integer; (c) for each of the groups, receiving an actual appliance measurement datum from an energy management system apparatus of the reference user in the group by connecting to the energy management system apparatus via the network interface, the actual appliance measurement datum being associated with M categories of appliances; (d) for each of the groups, labeling M encoded outputs among the M+1 encoded outputs according to the actual appliance measurement datum to map the M encoded outputs to the M categories of appliances; and (e) for each of the groups, establishing a non-intrusive load monitoring system (NILM) model of the group according to the M+1 encoded outputs after the M encoded outputs are labeled.

The disclosure also includes a power consumption analyzing method for a power consumption analyzing server. The power consumption analyzing server comprises a processor electrically connected to a network interface and a storage, the storage is configured to store a user database that records a user datum of each of a plurality of users, and the power consumption analyzing method comprises the following steps: (a) clustering the users into a plurality of groups according to the user data; (b) for each of the groups, generating M+1 encoded outputs by inputting a total power consumption time sequence datum of a reference user corresponding to the group among the user data into an autoencoder, where M is a positive integer; (c) for each of the groups, receiving an actual appliance measurement datum from an energy management system apparatus of the reference user in the group by connecting to the energy management system apparatus via the network interface, the actual appliance measurement datum being associated with M categories of appliances; (d) for each of the groups, labeling M encoded outputs among the M+1 encoded outputs according to the actual appliance measurement datum to map the M encoded outputs to the M categories of appliances; and (e) for each of the groups, establishing a non-intrusive load monitoring system (NILM) model of the group according to the M+1 encoded outputs after the M encoded outputs are labeled.

The detailed technology and preferred embodiments implemented for the subject invention are described in the following paragraphs accompanying the appended drawings for people skilled in this field to well appreciate the features of the claimed invention.

DETAILED DESCRIPTION

In the following description, the present invention will be explained with reference to example embodiments thereof. However, these example embodiments of the present invention are not intended to limit the present invention to any specific example, embodiment, environment, applications or implementations described in these example embodiments. Therefore, description of these example embodiments is only for purpose of illustration rather than to limit the scope of the present invention. Also, it shall be appreciated that, in the following embodiments and the attached drawings, elements unrelated to the present invention are omitted from depiction.

Figure 1:
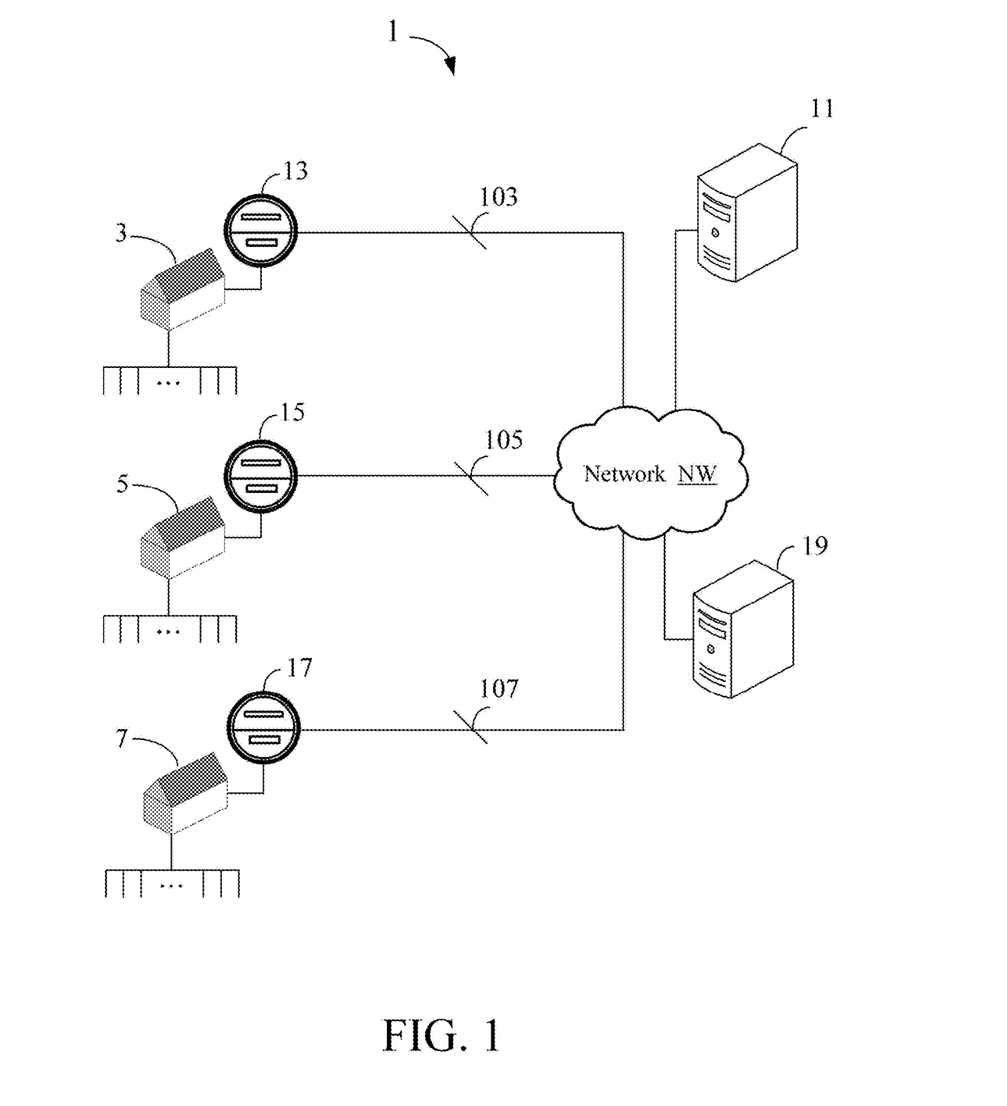
FIG. 1 is a schematic view of a non-intrusive electricity load monitoring system according to an embodiment of the present invention.

A first embodiment of the present invention is as shown in FIG. 1, which depicts a non-intrusive load monitoring (NILM) system 1. The NILM system 1 comprises a power consumption analyzing server 11, smart electricity meters 13, 15 and 17 and an electricity data server 19. The smart electricity meters 13, 15 and 17 are connected to the electricity data server 19 via a network NW. The power consumption analyzing server 11 is also connected to the electricity data server 19 via the network NW. The network NW may be a mobile communication network, an Internet, a local area network or a combination of the aforesaid networks.

The smart electricity meters 13, 15 and 17 are provided on buildings of users 3, 5, and 7 respectively corresponding to the smart electricity meters 13, 15 and 17 so as to record the total power consumption of the users and transmit real-time total power consumption data 103, 105 and 107 to the electricity data server 19. In the present invention, the total power consumption data 103, 105 and 107 are measured at a sampling rate of lower than or equal to one sample per minute. In other words, the total power consumption data 103, 105 and 107 are transmitted to the electricity data server 19 periodically, and each of them represents the total power consumption of all appliances of a corresponding user among the users 3, 5 and 7 that is measured at each sampling time point by one of the smart electricity meters 13, 15 and 17.

It shall be appreciated that, FIG. 1 only depicts the users 3, 5 and 7 and the corresponding smart electricity meters 13, 15 and 17 due to limitation of the size of the page. However, as shall be readily appreciated by those of ordinary skill in the art, the NILM system 1 of the present invention may serve hundreds, thousands or tens of thousands of users, so the number of the users and the number of the smart electricity meters are not intended to limit the present invention. Moreover, in this embodiment, the smart electricity meters 13, 15 and 17 and the electricity data server 19 belong to an electric power company while the power consumption analyzing server 11 belongs to a third-party provider, so the power consumption analyzing server 11 cooperates with the electricity data server 19 to obtain data of the users from the electricity data server 19. However, in other embodiments, the power consumption analyzing server 11 may belong to an electric power company, and the power consumption analyzing server 11 and the electricity data server 19 may be integrated into a single server. In this case, the power consumption analyzing server 11 may directly connect to the smart electricity meters 13, 15 and 17 via the network NW.

The power consumption analyzing server 11 will be further described hereinafter with reference to FIG. 2. The power consumption analyzing server 11 comprises a network interface 11a, a storage 11b and a processor 11c. The processor 11c is electrically connected to the network interface 11a and the storage 11b. The network interface 11a may be a wired network interface or a wireless network interface and connected to the electricity data server 19 via the network NW. The storage 11b may be a flash memory, a hard disk or any storage medium having the same function.

In this embodiment, the storage 11b stores a user database which records a user datum of each of a plurality of users (at least including users 3, 5 and 7). Each of the user data at least includes a total power consumption time sequence datum. Moreover, each of the user data may further comprise at least one of: statistical power consumption (e.g., total power consumption of a month, total power consumption of a day or the like), a load curve, a building category, a population in a house, a region category, and a climate category, but is not limited thereto. The processor 11c may be connected to the electricity data server 19 via the network interface 11c so as to obtain the user data from the electricity data server 19. Additionally, the user data not only can be obtained from the electricity data server 19 but also can be generated based on the total power consumption data (e.g., the total power consumption data 103, 105 and 107), or part of the user data may be directly obtained from the user side. In other words, the power consumption analyzing server 11 of the present invention may provide a webpage interface or a program interface used by a user applying the service for uploading the user data thereof.

The processor 11c clusters the users into a plurality of groups according to the user data. It shall be appreciated that, the clustering operation is for the purpose of distinguishing users that have similar power consumption behaviors and under similar environments, and the clustering operation may be achieved by adopting for example a K-means clustering algorithm or any other conventional algorithm. Therefore, any of the clustering algorithms capable of achieving the same objective falls within the scope claimed in the present invention. The clustering operation of the present invention is to perform one-dimensional, two-dimensional or multi-dimensional clustering or even perform multi-round clustering according to at least one parameter in the user data to cluster the users into the plurality of groups.

For example, the processor 11c may perform multi-dimensional clustering based on the statistical power consumption, the load curve and the population in a house in the user data. It is assumed that the clustering result is that the users 3 and 5 are classified into a same group and the user 7 is classified into another group. It shall be noted that, as described previously, the NILM system 1 of the present invention may serve hundreds, thousands or tens of thousands of users, so the number of the groups and the number of users in each of the groups after the clustering operation are not intended to limit the scope claimed in the present invention.

Next, for each of the groups after the clustering operation, the processor 11c selects a reference user from the group and generates M+1 encoded outputs by inputting a total power consumption time sequence datum of the reference user corresponding to the group into an autoencoder AE, wherein M is a positive integer. The autoencoder AE may be a sparse autoencoder, a convolutional autoencoder, a denoising autoencoder, a retractable autoencoder or the like. It shall be appreciated that, the present invention may select a user that is closer to the center of a group and thus is representative during the clustering operation as the reference user to increase the reference value, and the reference user needs to be provided with an energy management system. Moreover, no limitation is made to the number of reference users by the present invention, so the number of the reference users may be increased or decreased depending on practical demands of system operation.

Furthermore, the total power consumption time sequence datum may be obtained from the total power consumption datum of the user by setting an observation window. As described previously, a smart electricity meter generates a total power consumption datum for the total power consumed by all appliances of a corresponding user that is measured at each sampling time point. Therefore, taking the user 3 as the reference user for illustration, the total power consumption data of the user 3 may be represented as $p_1$, $p_2$, ..., $p_t$ in time sequence, wherein t is a positive integer, so $p_t$ means the total power consumption measured at the $t^{th}$ sampling time point. For example, the smart electricity meter may be set to measure the total power consumption every 15 minutes. Therefore, if the total power consumption $p_1$ represents the total power consumption measured at PM 1:00, then the total power consumption $p_2$ represents the total power consumption measured at PM 1:15.

The total power consumption time sequence datum TU may be constituted by several sub-total power consumption time sequence data $tu_1$, $tu_2$, ..., $tu_n$, i.e., TU={$tu_1$, $tu_2$, ..., $tu_n$}, wherein n is a positive integer. If there are 128 sample for the observation window, then the sub-total power consumption time sequence datum $tu_i$ (i=1~n) can be presented by an array constituted by 128 samples of measured total power consumption. For example, if two sub-total power consumption time sequence data $tu_i$ that are adjacent in time sequence are non-overlapped with each other, then $tu_1$={$p_1$, $p_2$, ..., $p_{128}$}, $tu_2$={$p_{129}$, $p_{130}$, ..., $p_{256}$} ..., and so on. Additionally, two sub-total power consumption time sequence data $tu_i$ that are adjacent in time sequence may also be partly overlapped with each other, for example, $tu_1$={$p_1$, $p_2$, ..., $p_{128}$}, $tu_2$={$p_{65}$, $p_{66}$, ..., $p_{192}$} ..., and so on. Various configurations of the total power consumption time sequence data TU of the present invention shall be appreciated by those of ordinary skill in the art based on the above descriptions, and thus will not be further described herein. Moreover, as shall be appreciated by those of ordinary skill in the art based on the above descriptions, the measuring and sampling rate of the smart electricity meter may be increased (e.g., from one sample per 15 minutes to one sample per minute) in order to increase the accuracy of power consumption analysis, and this will also not be further described herein.

Figure 3:
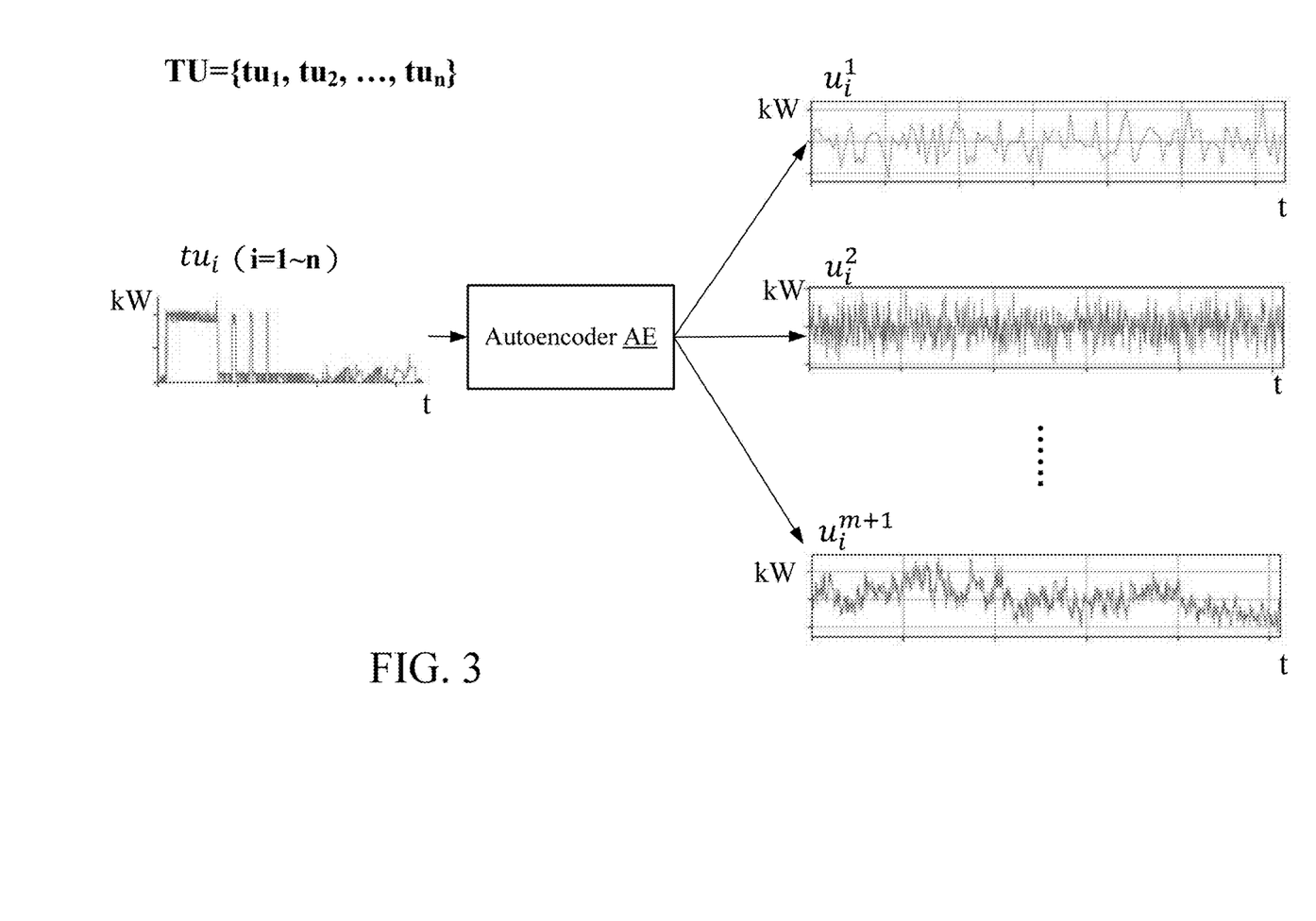
FIG. 3 is a schematic view depicting the input and the output of an autoencoder.

Please further refer to FIG. 3, which depicts an exemplary example of inputting the total power consumption time sequence data TU into the autoencoder AE. The power consumption analysis to be achieved by the present invention mainly focuses on the power consumption of main appliances, e.g., a refrigerator, an air conditioner, a thermos bottle or the like, so M encoded outputs among the M+1 encoded outputs generated by the autoencoder AE may correspond to the power consumption of M categories of main appliances while the remaining one encoded output corresponds to the power consumption of other appliances rather than the M categories of main appliances in the present invention.

Further speaking, relationships among the input and the output of the autoencoder AE may be represented by the following equation 1:

$$tu_i = \sum_{j=1}^{M+1} u_i^j \qquad \text{(Equation 1)}$$

where the sub-total power consumption time sequence datum $tu_i$ is one of the sub-total power consumption time sequence data $tu_1$, $tu_2$, ..., $tu_n$, and $u_i^j$ represents the $j^{th}$ encoded output of the sub-total power consumption time sequence datum $tu_i$, wherein j=1~M+1. In FIG. 3, the sub-total power consumption time sequence datum $tu_i$ and the corresponding $j^{th}$ encoded output $u_i^j$ are represented by a graph, and the vertical axis is the total power consumption (kW) and the horizontal axis is the time sequence (t).

Thereafter, for each of the groups in which the encoded outputs have been generated, the processor 11c receives an actual appliance measurement datum from an energy management system apparatus of the reference user in the group by connecting to the energy management system apparatus via the network interface 11a. Next, for each of the groups, the processor 11c labels M encoded outputs among the M+1 encoded outputs generated by the autoencoder AE according to the received actual appliance measurement datum (which at least includes the actual appliance measurement datum of M categories of appliances) to map the M encoded outputs to the M categories of appliances.

For example, in the case where the user 3 is the reference user and is provided with the energy management system apparatus, the energy management system apparatus connects to K sensors that are additionally attached to the K main appliances. The energy management system apparatus may measure the power consumption of the K main appliances via the K sensors so as to obtain the actual measurement data of the K main appliances. It shall be appreciated that, the value of K may be set to be the same as the value of M (i.e., only the M categories of appliances are measured) or the value of K may be set to be greater than the value of M (i.e., more than M categories of appliances are measured) based on actual requirements of labeling. In this way, according to the actual measurement data, the processor 11c can learn the power consumption of which main appliances is included in the total power consumption data measured and generated by the smart electricity meter 13, and label the M encoded outputs to respectively correspond to M categories of appliances through the reinforcement learning algorithm.

A simple example is provided for illustration, in which it is assumed that M=7 (i.e., there are 7 categories of main appliances to be analyzed). When only the encoded outputs $u_2^2$ and $u_2^5$, among the encoded outputs $u_2^1$, $u_2^2$, $u_2^3$, $u_2^4$, $u_2^5$, $u_2^6$, $u_2^7$, and $u_2^8$ that are generated by inputting the sub-total power consumption time sequence datum $tu_2$ into the autoencoder AE, generates obvious waveforms, the processor 11c can find out that the main appliances being used in the actual time interval corresponding to the sub-total power consumption time sequence datum $tu_2$ are a washing machine and an air conditioner based on the actual measurement data, and determine that the encoded outputs $u_2^2$ and $u_2^5$ may respectively correspond to the washing machine and the air conditioner. Additionally, when only the encoded output $u_3^5$, among the encoded outputs $u_3^1$, $u_3^2$, $u_3^3$, $u_3^4$, $u_3^5$, $u_3^6$, $u_3^7$, and $u_3^8$ that are generated by inputting the sub-total power consumption time sequence datum $tu_3$ into the autoencoder AE, generates an obvious waveform, the processor 11c can determine the main appliance being used by the user 3 in the actual time interval corresponding to the sub-total power consumption time sequence datum $tu_3$ as the air conditioner based on the actual measurement data. Therefore, the processor 11c may label the encoded output $u_i^2$ as the washing machine and label the encoded output $u_i^5$ as the air conditioner through such a matching manner.

By matching relationships between the encoded output $u_i^j$ corresponding to each sub-total power consumption time sequence datum $tu_i$ and the actual measurement data, the processor 11c may label the M encoded outputs to respectively correspond to M categories of appliances. Finally, for each of the groups in which the M encoded outputs have been labeled, the processor 11c establishes an NILM system model of the group according to the M+1 encoded outputs of the group. For example, the power consumption analyzing server 11 may take the NILM system model established based on the reference user 3 as the NILM system model of the group to which the reference user 3 belongs. Therefore, based on the NILM system model, the power consumption analyzing server 11 may analyze the total power consumption time sequence data of a served user (e.g., the user 5) of the group to learn the power consumption of the main appliances of the user 5 and generate a power consumption suggestion datum to be used by the user 5 as a power consumption reference.

It shall be appreciated that, it is assumed in this embodiment that the energy management system apparatus is provided on a building of the user. However, in other embodiments, the energy management system apparatus may also be a cloud apparatus which connects to a sensor additionally attached on an appliance via the network NW. Moreover, in other embodiments, when selecting the reference user, the present invention can not only select the user that is closer to the center of the group and thus is representative during the clustering, but can also select a user of which the M categories of appliances are used more separately in terms of time to increase the labeling efficiency.

In other embodiments, when the user changes the user datum thereof, the power consumption analyzing server 11 can rapidly cluster the user into another suitable group according to the user datum updated by the user, and apply the NILM system model of the new group to the user. For example, when the user moves from an apartment building to an independent house, to an area of a higher temperature or the population in the house varies, the power consumption analyzing server 11 can rapidly analyze relevant characteristic factors after the variation to cluster the user into a suitable group according to the user datum updated by the user, and directly apply the NILM system model of the new group to the user. Accordingly, when the environmental factor of the user changes, the present invention does not need to re-collect data to establish different NILM system models, and thus will not increase the cost of establishing the models.

Additionally, in an embodiment, for M+1 encoded outputs, the manager of the power consumption analyzing server 11 may first pre-label M+1 encoded outputs, then determine labels of the encoded outputs according to the actual measurement data via the processor 11c, and further label the encoded output that cannot be pre-labeled. Moreover, in other embodiments, other user data (e.g., a load curve) may also be inputted into the autoencoder as another dimension in addition to inputting the total power consumption time sequence data into the autoencoder. Operations of the aforesaid other embodiments of the present invention for achieving the purpose of labeling the encoded outputs of the autoencoder shall be appreciated by those of ordinary skill in the art based on the aforesaid descriptions, and thus will not be further described herein.

Additionally, in other embodiments, the power consumption analyzing server 11 may belong to an electric power company, and the power consumption analyzing server 11 and the power data server 19 may be integrated into a single server as described previously. In this case, the power consumption analyzing server 11 may directly connect to the smart electricity meters 13, 15 and 17 via the network NW. Therefore, the processor 11c may connect to the smart electricity meters 13, 15 and 17 via the network interface 11a.

Figure 2:
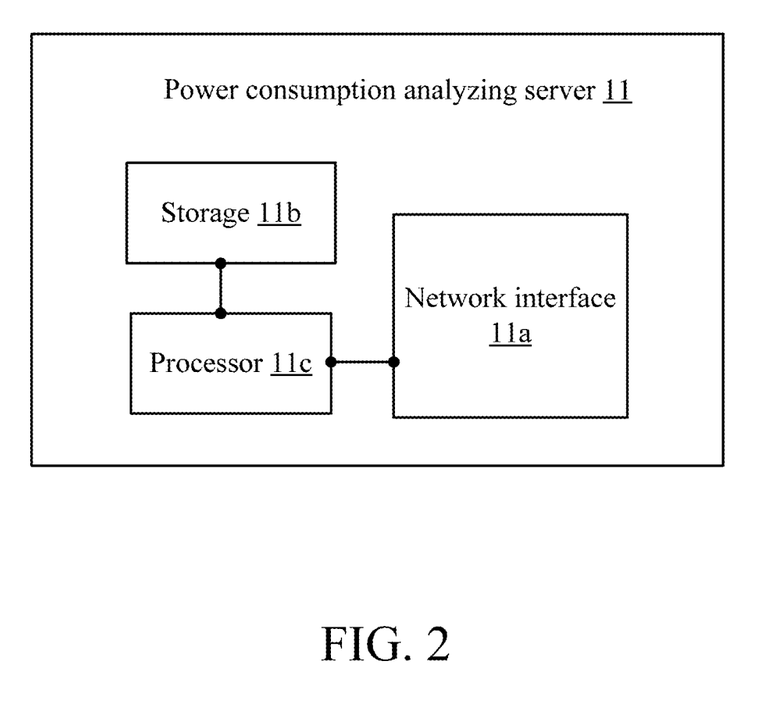
FIG. 2 is a schematic view of a power consumption analyzing server according to an embodiment of the present invention.

Please still refer to FIG. 1 and FIG. 2 for a second embodiment of the present invention, which is an extension of the first embodiment. In this embodiment, for the NILM system model established for each group, the processor 11c further corrects the non-intrusive load monitoring system model of the group according to the actual appliance measurement datum of the reference user.

For example, for the NILM system model of the user 3, $u_i^5$ has been labeled as the air conditioner, so the processor 11c determines the power consumption of the user 3 according to the waveform of the encoded output $u_i^5$ corresponding to $tu_i$ before the NILM system model is corrected. However, there may be many categories of non-main appliances or small appliances in the actual environment of the user 3, so the encoded output $u_i^5$ may also comprise components of other non-main appliances. In this case, the processor 11c may correct the NILM system model based on the actual power consumption of the air conditioner measured by the energy management system apparatus of the user 3. If the actual appliance measurement data shows that the maximum power consumption of the air conditioner is 1200 W and the minimum power consumption thereof is 200 W, and the waveform of the encoded output $u_i^5$ has a maximum value of 1300 W and a minimum value of 300 W, then the processor 11c may further adjust the waveform of the encoded output $u_i^5$ outputted from the autoencoder in the NILM system model before analyzing the power consumption of the user based on the waveform that has been adjusted. Accordingly, the power consumption analyzing server 11 of the present invention may perform feedback training according to the actual measurement data collected by the energy management system so as to adjust the analyzing result of the non-intrusive load monitoring system model and improve the tolerance to various environments.

Figure 4:
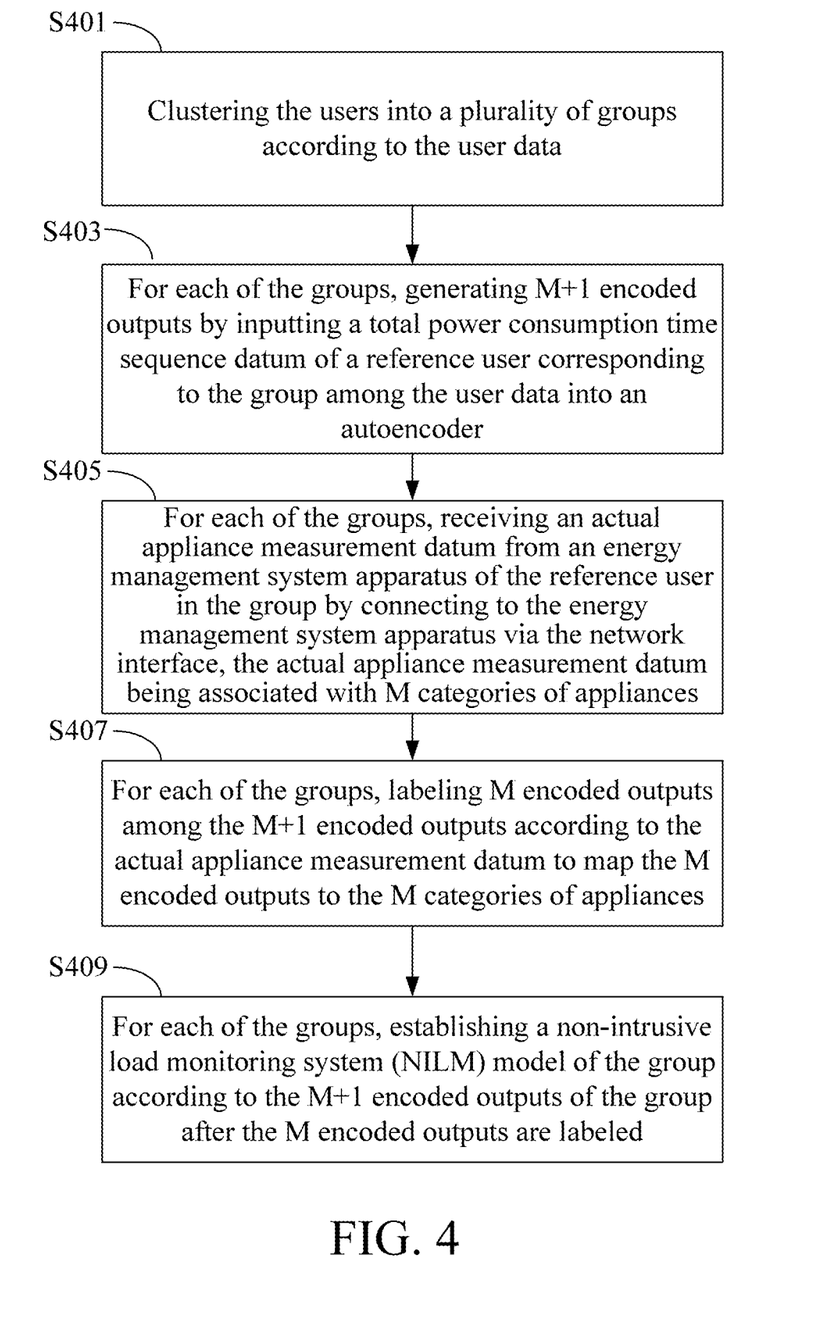
FIG. 4 is a flowchart diagram of a power consumption analyzing method according to an embodiment of the present invention.

A third embodiment of the present invention is a power consumption analyzing method for a power consumption analyzing server, and a flowchart diagram thereof is as shown in FIG. 4. The power consumption analyzing method of this embodiment is adapted for use in a power consumption analyzing server (e.g., the power consumption analyzing server 11 of the aforesaid embodiments). The power consumption analyzing server comprises a processor, a network interface and a storage. The storage is configured to store a user database. The user database is configured to record a user datum of each of a plurality of users. The processor may connect to an electricity data server via the network interface so as to obtain the user data of the users from the electricity data server. The power consumption analyzing method is executed by the processor.

First, in step S401, the users are clustered into a plurality of groups according to the user data. As described in the aforesaid embodiments, the power consumption analyzing server may perform one-dimensional, two-dimensional or multi-dimensional clustering according to at least one parameter in the user data to cluster the users into the groups. Next, in step S403, for each of the groups, M+1 encoded outputs are generated by inputting a total power consumption time sequence datum of a reference user corresponding to the group among the user data into an autoencoder, where M is a positive integer. Thereafter, in step S405, for each of the groups, an actual appliance measurement datum is received from an energy management system apparatus of the reference user in the group by connecting to the energy management system apparatus via the network interface. The actual appliance measurement datum is associated with M categories of appliances.

Next, in step S407, for each of the groups, M encoded outputs are labeled among the M+1 encoded outputs according to the actual appliance measurement datum to map the M encoded outputs to the M categories of appliances. Finally, in step S409, for each of the groups, a non-intrusive load monitoring system (NILM) model of the group is established according to the M+1 encoded outputs after the M encoded outputs are labeled.

Figure 5A:
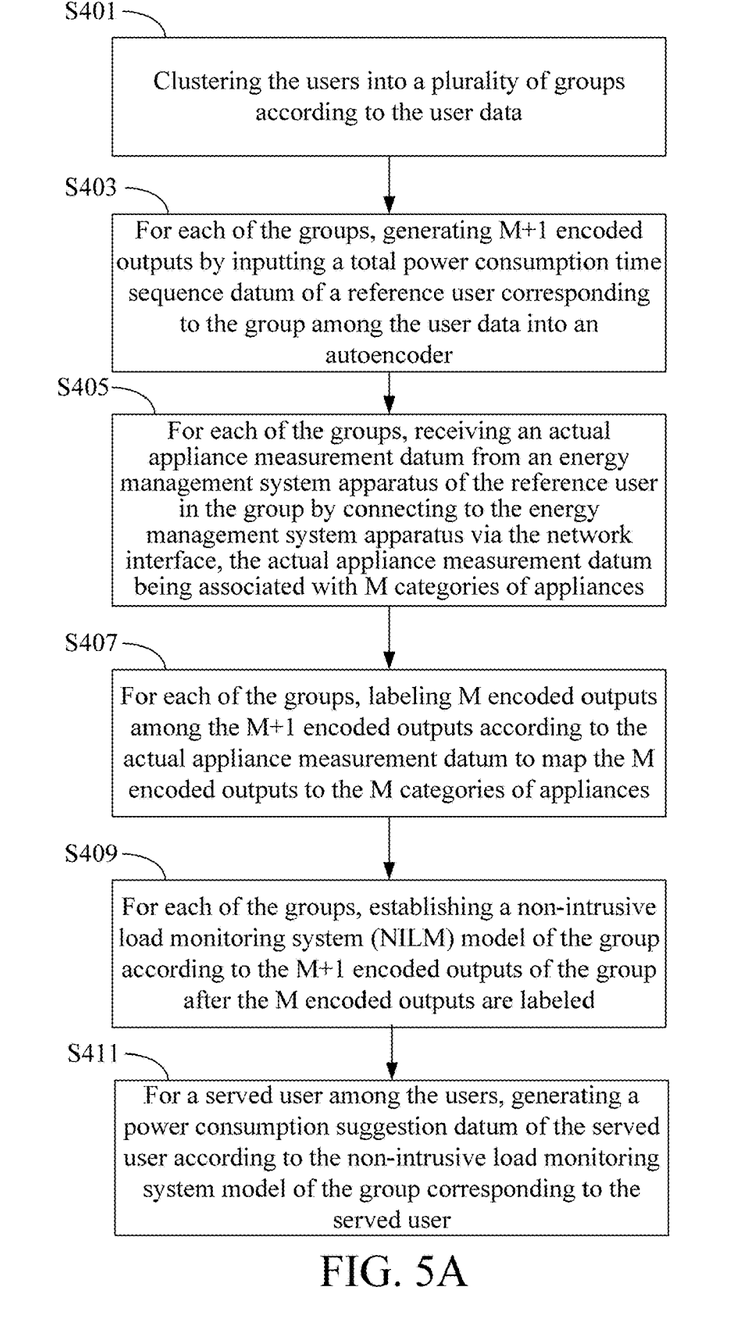
FIG. 5A is a flowchart diagram of a power consumption analyzing method according to another embodiment of the present invention.
Figure 5B:
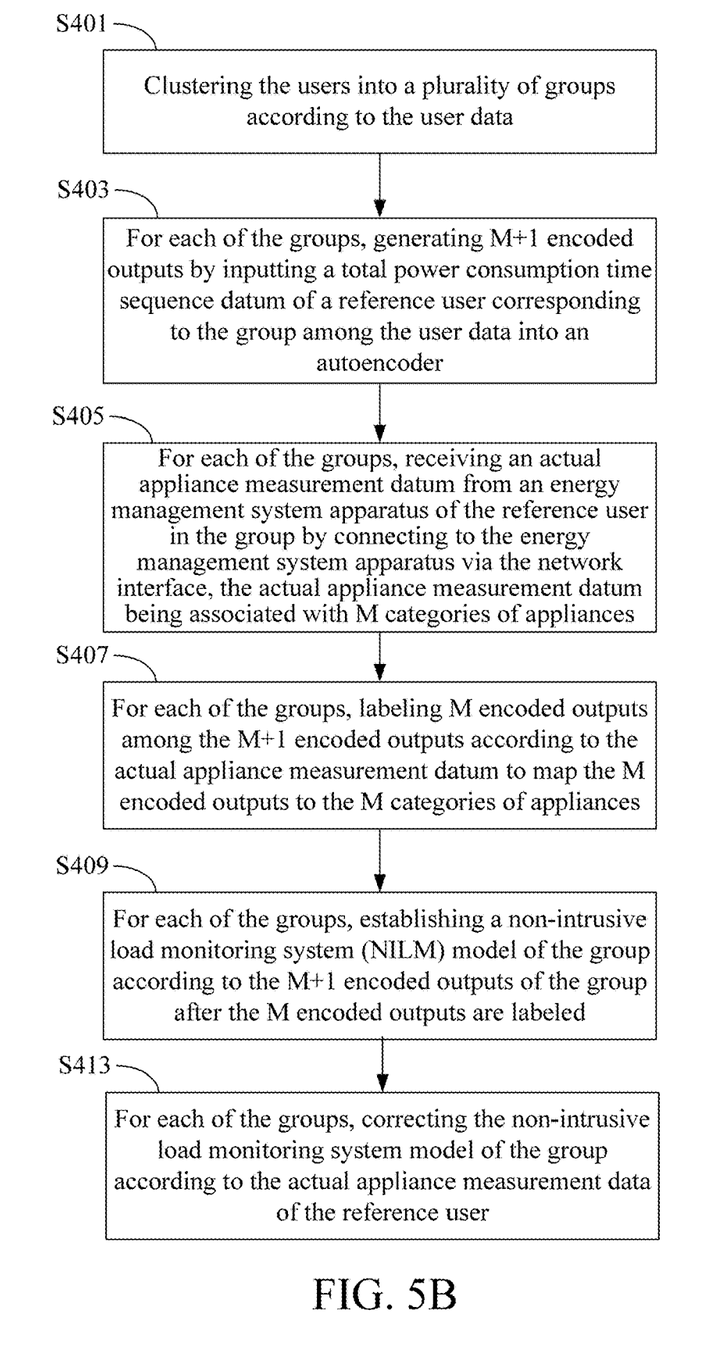
FIG. 5B is a flowchart diagram of a power consumption analyzing method according to another embodiment of the present invention.

Moreover, in an embodiment, each of the user data further comprises at least one of: statistical power consumption, a load curve, a building category, a population in a house, a region category, and a climate category. In an embodiment, the total power consumption time sequence data are measured at a sampling rate of lower than or equal to one sample per minute. In an embodiment, as shown in FIG. 5A, the power consumption analyzing method of the present invention may further comprise the following step S411: for a served user among the users, generating a power consumption suggestion datum of the served user according to the non-intrusive load monitoring system model of the group corresponding to the served user. Additionally, in an embodiment, the power consumption analyzing method of the present invention may further comprise the following step S413 as shown in FIG. 5B: for each of the groups, correcting the non-intrusive load monitoring system model of the group according to the actual appliance measurement data of the reference user.

Moreover, in an embodiment, the power consumption analyzing server may connect to an electricity data server to obtain the total power consumption data of the users from the electricity data server, and the total power consumption time sequence datum of the reference user may be obtained from the total power consumption datum of the reference user by setting an observation window. Moreover, the total power consumption datum may be constituted by a plurality of sub-total power consumption time sequence data, and any two of the sub-total power consumption time sequence data that are adjacent in time sequence may be partly overlapped or non-overlapped with each other.

Furthermore, in other embodiments, the power consumption analyzing server may belong to an electric power company, and may be integrated into a single server with the electricity data server. In this case, the power consumption analyzing server may directly connect to a plurality of smart electricity meters via the network.

In addition to the aforesaid steps, the power consumption analyzing method of this embodiment can also execute all the operations and functions set forth in the aforesaid embodiments. How this embodiment executes these operations and functions will be readily appreciated by those of ordinary skill in the art based on the disclosure of the aforesaid embodiments, and thus will not be further described herein.

According to the above descriptions, the power consumption analyzing mechanism of the present invention clusters users into groups and establishes an NILM system model respectively for each group of the users. Therefore, when a new user appears or the user environment changes, a most suitable NILM system model can be selected from the NILM system models of the user groups to be applied to the new user or the user of which the environment changes, thereby avoiding the problem of overfitting. Moreover, the power consumption analyzing mechanism of the present invention can obtain the total power consumption data of the user by measuring at a low sampling rate, and generate labeled data without manual intervention so as to avoid complicated manual operations. Moreover, the power consumption analyzing mechanism of the present invention can further cooperate with the energy management system apparatus to obtain the actual appliance measurement datum, thereby adjusting the power consumption analyzing model and improving the tolerance to various environments.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A power consumption analyzing server, comprising:
   a network interface;
   a storage, being configured to store a user database that records a user datum of each of
   a plurality of users;
   a processor electrically connected with the network interface and the storage, being configured to execute the following steps:
   (a) clustering the users into a plurality of groups according to the user data;
   (b) for each of the groups, generating M+1 encoded outputs by inputting a total power consumption time sequence datum of a reference user corresponding to the group among the user data into an autoencoder, where M is a positive integer;
   (c) for each of the groups, receiving an actual appliance measurement datum from an energy management system apparatus of the reference user in the group by connecting to the energy management system apparatus via the network interface, the actual appliance measurement datum being associated with M categories of appliances;
   (d) for each of the groups, labeling M encoded outputs among the M+1 encoded outputs according to the actual appliance measurement datum to map the M encoded outputs to the M categories of appliances; and
   (e) for each of the groups, establishing a non-intrusive load monitoring system (NILM) model of the group according to the M+1 encoded outputs and the actual appliance measurement datum after the M encoded outputs are labeled.

2. The power consumption analyzing server of claim 1, wherein each of the user data further comprises at least one of: statistical power consumption, a load curve, a building category, a population in a house, a region category, and a climate category.

3. The power consumption analyzing server of claim 1, wherein the total power consumption time sequence data are measured at a sampling rate of lower than or equal to one sample per minute.

4. The power consumption analyzing server of claim 1, wherein for a served user among the users, the processor further generates a power consumption suggestion datum according to the non-intrusive load monitoring system model of the group.

5. The power consumption analyzing server of claim 1, wherein for each of the groups, the processor further corrects the non-intrusive load monitoring system model of the group according to the actual appliance measurement data of the reference user.

6. The power consumption analyzing server of claim 1, wherein the processor performs one-dimensional, two-dimensional or multi-dimensional clustering according to at least one parameter in the user data to cluster the users into the groups.

7. The power consumption analyzing server of claim 1, wherein the processor further connects to an electricity data server via the network interface to obtain the user data of the users from the electricity data server.

8. The power consumption analyzing server of claim 1, wherein the processor further connects to an electricity data server via the network interface to obtain a total power consumption datum of each of the users from the electricity data server, wherein the total power consumption time sequence datum of the reference user is obtained from the total power consumption datum of the reference user by setting an observation window.

9. The power consumption analyzing server of claim 8, wherein the total power consumption datum is constituted by a plurality of sub-total power consumption time sequence data, and any two of the sub-total power consumption time sequence data that are adjacent in time sequence are partly overlapped or non-overlapped with each other.

10. The power consumption analyzing server of claim 1, wherein the processor further connects to a plurality of smart electricity meters via the network interface.

11. A power consumption analyzing method for a power consumption analyzing server, the power consumption analyzing server comprising a processor, a network interface and a storage, the storage being configured to store a user database that records a user datum of each of a plurality of users, the power consumption analyzing method being executed by the processor and comprising the following steps:
   (a) clustering the users into a plurality of groups according to the user data;
   (b) for each of the groups, generating M+1 encoded outputs by inputting a total power consumption time sequence datum of a reference user corresponding to the group among the user data into an autoencoder, where M is a positive integer;
   (c) for each of the groups, receiving an actual appliance measurement datum from an energy management system apparatus of the reference user in the group by connecting to the energy management system apparatus via the network interface, the actual appliance measurement datum being associated with M categories of appliances;
   (d) for each of the groups, labeling M encoded outputs among the M+1 encoded outputs according to the actual appliance measurement datum to map the M encoded outputs to the M categories of appliances; and
   (e) for each of the groups, establishing a non-intrusive load monitoring system (NILM) model of the group according to the M+1 encoded outputs and the actual appliance measurement datum after the M encoded outputs are labeled.

12. The power consumption analyzing method of claim 11, wherein each of the user data further comprises at least one of: statistical power consumption, a load curve, a building category, a population in a house, a region category, and a climate category.

13. The power consumption analyzing method of claim 11, wherein the total power consumption time sequence data are measured at a sampling rate of lower than or equal to one sample per minute.

14. The power consumption analyzing method of claim 11, further comprising the following step:
   for a served user among the users, generating a power consumption suggestion datum according to the non-intrusive load monitoring system model of the group corresponding to the served user.

15. The power consumption analyzing method of claim 11, further comprising the following step:

for each of the groups, correcting the non-intrusive load monitoring system model of the group according to the actual appliance measurement data of the reference user.

16. The power consumption analyzing method of claim 11, wherein the step (a) is to perform one-dimensional, two-dimensional or multi-dimensional clustering according to at least one parameter in the user data to cluster the users into the groups.

17. The power consumption analyzing method of claim 11, further comprising the following step:

connecting to an electricity data server via the network interface to obtain the user data of the users from the electricity data server.

18. The power consumption analyzing method of claim 11, wherein the power consumption analyzing server connects to an electricity data server to obtain a total power consumption datum of each of the users from the electricity data server, wherein the total power consumption time sequence datum of the reference user is obtained from the total power consumption datum of the reference user by setting an observation window.

19. The power consumption analyzing method of claim 18, wherein the total power consumption datum is constituted by a plurality of sub-total power consumption time sequence data, and any two of the sub-total power consumption time sequence data that are adjacent in time sequence are partly overlapped or non-overlapped with each other.

20. The power consumption analyzing method of claim 11, wherein the power consumption analyzing server connects to a plurality of smart electricity meters.

* * * * *